(12) United States Patent
Chen

(10) Patent No.: US 6,704,205 B1
(45) Date of Patent: Mar. 9, 2004

(54) EXPANSION CARD MOUNTING APPARATUS

(75) Inventor: Yun-Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/452,564

(22) Filed: May 30, 2003

(30) Foreign Application Priority Data

Mar. 21, 2003 (TW) ........................................ 92204450 U

(51) Int. Cl.[7] .............................. H05K 1/14; H05K 5/00
(52) U.S. Cl. ....................... 361/740; 361/732; 361/747; 361/759; 361/801; 361/802; 361/752; 439/327; 211/41.17; 312/223.2
(58) Field of Search .................................. 361/683–686, 361/728, 732, 740–741, 747, 752, 753, 756, 759, 800, 801, 802, 807, 798, 816, 818, 737; 312/223.1, 223.2, 216, 293.3, 265.5, 265.6, 183; 211/41.17, 26; 439/327, 368; 174/35 R, 35 GC, 50, 50.51, 50.52, 51, 66, 67

(56) References Cited

U.S. PATENT DOCUMENTS

| 4,745,524 | A | | 5/1988 | Patton, III |
| 5,317,483 | A | | 5/1994 | Swindler |
| 5,673,175 | A | * | 9/1997 | Carney et al. ............... 361/686 |
| 5,748,453 | A | * | 5/1998 | Carney et al. ............... 361/801 |
| 5,936,835 | A | | 8/1999 | Astier |
| 6,231,139 | B1 | * | 5/2001 | Chen ........................ 312/223.2 |
| 6,487,089 | B1 | * | 11/2002 | Otis ............................ 361/796 |
| 2002/0122293 | A1 | * | 9/2002 | Kohler et al. ............... 361/683 |

* cited by examiner

Primary Examiner—Phuong T. Vu
(74) Attorney, Agent, or Firm—Wei Te Chung

(57) ABSTRACT

An expansion card mounting apparatus includes: a rear panel (10) defining an opening (11) and having a support plate (12) adjacent the opening for supporting slot covers (50) of expansion cards; a mounting frame (20) having a pressing portion (21), a mounting portion (28) engaging with a top flange (15) of the rear panel, and a connecting wall (25); a slide member (30) attached to the connecting wall; and a top panel (100). The slide member includes two slide portions (38) slidably engaging with the rear panel at opposite sides of the opening. When the top panel is attached to the top flange of the rear panel, the mounting portion of the mounting frame is positioned in place. The slot covers are thus secured between the support plate of the rear panel and the pressing portion of the mounting frame.

17 Claims, 3 Drawing Sheets

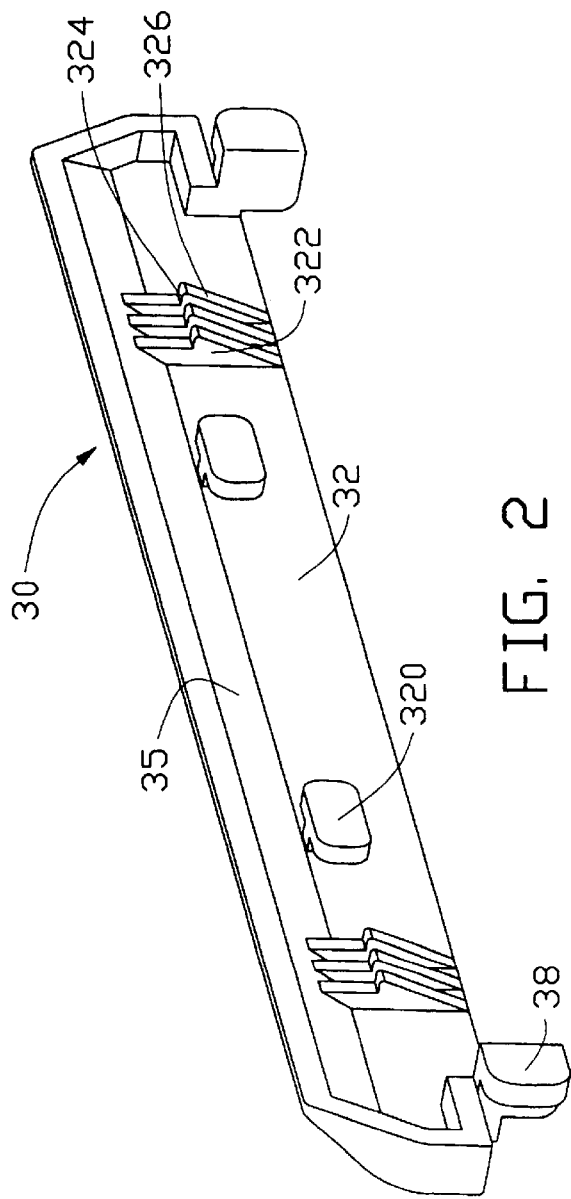
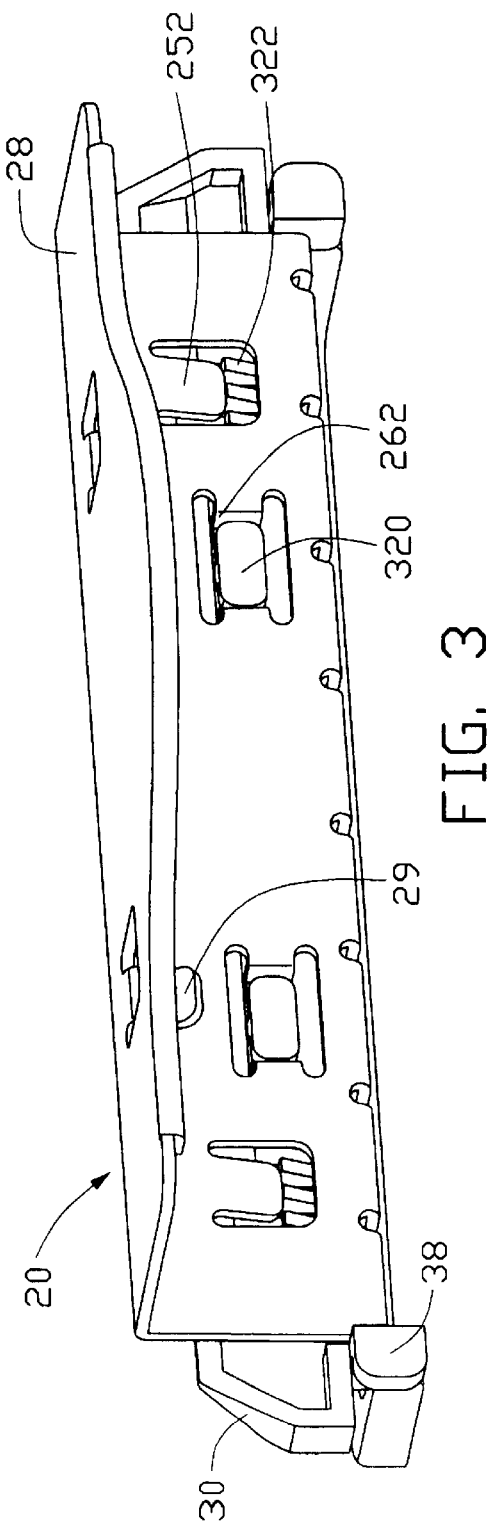

EXPANSION CARD MOUNTING APPARATUS

BACKGROUND OF THE INVENTION

1. Field of the Invention

The present invention relates to mounting apparatuses, and more particularly to a mounting apparatus for readily and securely mounting expansion cards in a computer enclosure.

2. Related Art

Many computer systems comprise not only a mother board, but also one or more expansion cards electrically connected to the motherboard to provide specialized functions. It is required that the expansion cards be reliably retained within the computer enclosure to prevent disengagement from the motherboard when the computer is subjected to shock and vibration during delivery and use thereof.

U.S. Pat. No. 5,317,483 discloses a mounting apparatus for mounting expansion cards to a chassis. The mounting apparatus includes a pressing body having one end pivotably mounted to a support plate of the chassis. After the pressing body is pivoted to a position in which slot covers of the expansion cards are sandwiched between the pressing body and the support plate, the other end of the pressing body is fastened to the support plate with a screw. The expansion cards are thus secured to chassis.

U.S. Pat. No. 5,936,835 discloses another expansion card mounting apparatus. The mounting apparatus has a plurality of spring fingers and a mounting portion. After the mounting apparatus is disposed in a position in which the spring fingers respectively press corresponding slot covers of expansion cards, the mounting portion is screwed to the chassis. The expansion cards are thus secured to the chassis.

Both of the above-mentioned prior art apparatuses can mount a plurality of expansion cards at one time. However, when installing or removing several expansion cards, using the screw fasteners is laborious and time-consuming. In addition, a tool such as a screwdriver or a wrench is usually required.

SUMMARY OF THE INVENTION

Accordingly, an object of the present invention is to provide an apparatus for readily and efficiently installing and removing expansion cards to and from equipment such as a chassis of a computer.

To achieve the above-mentioned object, an expansion card mounting apparatus in accordance with a preferred embodiment of the present invention comprises a rear panel, a mounting frame, a slide member for slidably attaching the mounting frame to the rear panel, and a top panel. The rear panel defines an opening, and comprises a support plate adjacent the opening for supporting slot covers of expansion cards thereon. The mounting frame comprises a pressing portion corresponding to the support plate, a mounting portion engaging with a top flange of the rear panel, and a connecting wall interconnecting the pressing portion with the mounting portion. The slide member is attached to the connecting portion and slidably engaged with the rear panel at opposite sides of the opening. When the top panel is attached to the top flange of the rear panel, the mounting portion is positioned in place. The slot covers are thus secured between the support plate of the rear panel and the pressing portion of the mounting frame.

Other objects, advantages and novel features of the present invention will be drawn from the following detailed description of the preferred embodiment of the present invention with attached drawings, in which:

BRIEF DESCRIPTION OF THE DRAWINGS

FIG. 2 is an enlarged, isometric view of the slide member of the mounting apparatus of FIG. 1;

FIG. 3 is an enlarged, isometric view of the slide member attached to the mounting frame of the mounting apparatus of FIG. 1.

DESCRIPTION OF THE PREFERRED EMBODIMENTS

The present invention will be described in its preferred embodiments, and in conjunction with slot covers of expansion cards.

Figure 1:
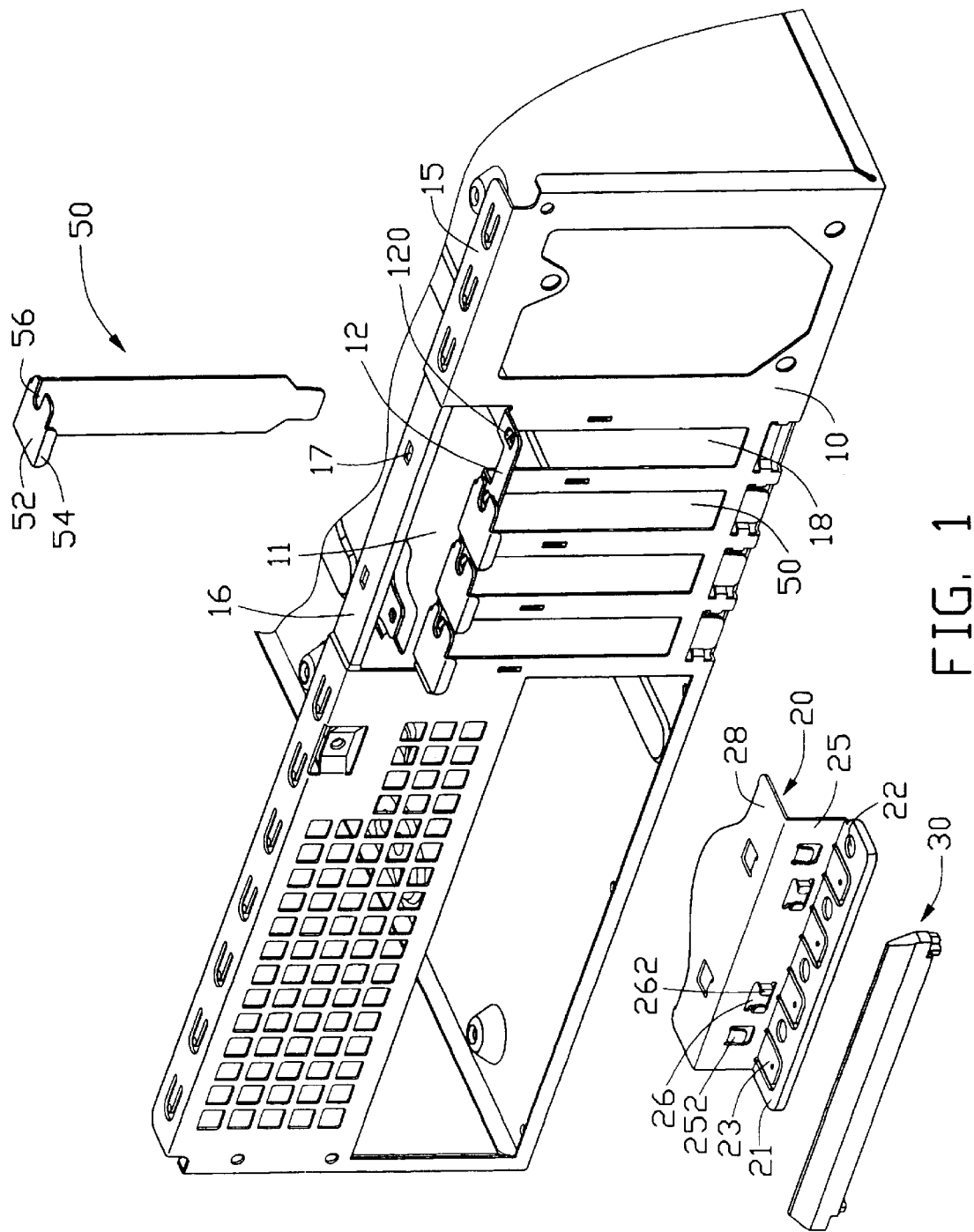
FIG. 1 is an exploded, isometric view of an expansion card mounting apparatus in accordance with the preferred embodiment of the present invention, together with slot covers of expansion cards, the expansion card mounting apparatus comprising a rear panel, a mounting frame, and a slide member.

FIG. 1 shows an expansion card mounting apparatus in accordance with the preferred embodiment of the present invention, together with a plurality of slot covers 50 of expansion cards. The mounting apparatus comprises a rear panel 10, a mounting frame 20, and a slide member 30 for slidably attaching the mounting frame 20 to the rear panel 10.

The slot cover 50 comprises an end portion 52 defining a cutout 56 therein. A lip 54 depends from a side of the end portion 52.

The rear panel 10 defines a horizontal opening 11 in a top portion thereof. A support plate 12 extends outwardly from the rear panel 10 at a bottom extremity of the opening 11. A plurality of protrusions 120 is formed on the support plate 12. A plurality of evenly spaced vertical expansion slots 18 is defined in the rear panel 10, in communication with the opening 11. In FIG. 1, three slot covers 50 are attached to the rear panel 10 at respective expansion slots 18, and one slot cover 50 is separate from the rear panel 10 for clear illustration. A shallow recessed portion 16 is defined in a top flange 15 of the rear panel 10, generally above the opening 11. Two spaced mounting holes 17 are defined in the recessed portion 16.

The mounting frame 20 comprises a pressing portion 21, and a mounting portion 28 connected to the pressing portion 21 by a connecting wall 25. The pressing portion 21 comprises a plurality of resilient tongues 23, for resiliently pressing the end portions 52 of the slot covers 50 respectively. A plurality of positioning holes 22 is defined in the pressing portion 21, corresponding to the protrusions 120 of the support plate 12. The connecting wall 25 is stamped rearwardly to form two resilient tabs 252 that project slightly obliquely from the connecting wall 25. Two spaced apertures 26 are defined in the connecting wall 25 between the tabs 252. A pair of L-shaped clips 262 extends rearwardly from opposite side extremities of each aperture 26. Referring to FIG. 3, the mounting portion 28 is stamped downwardly to form two mounting tabs 29, corresponding to the mounting holes 17 of the rear panel 10.

Referring to FIG. 2, the slide member 30 is made of resilient material such as plastic. The slide member 30 comprises a vertical wall 32, and an inclined wall 35 integrally extending from a top edge of the vertical wall 32.

Two T-shaped latches 320 extend from an inside of the vertical wall 32, for engaging with the L-shaped clips 262 of the mounting frame 20 respectively. Two sets of catches 322 extend from a combined inside of the vertical wall 32 and inside of the inclined wall 35, the two sets of catches 322 corresponding to the resilient tabs 252 of the mounting frame 20. In the preferred embodiment, each set of catches 322 includes three catches 322. The number of catches 322 in each set may be varied according to need. Each catch 322 comprises an indented portion 324 and a sloped portion 326. The indented portions 324 of each set of catches 322 are aligned and are used for engaging with a corresponding resilient tab 252. Two slide portions 38 are formed at opposite ends of the slide member 30 respectively, for slidably engaging with the rear panel 10 at opposite sides of the opening 11. In the preferred embodiment, each slide portion 30 has an L-shaped structure. A distance between distal ends of the slide portions 38 is greater than a width of the opening 11.

Figure 4:
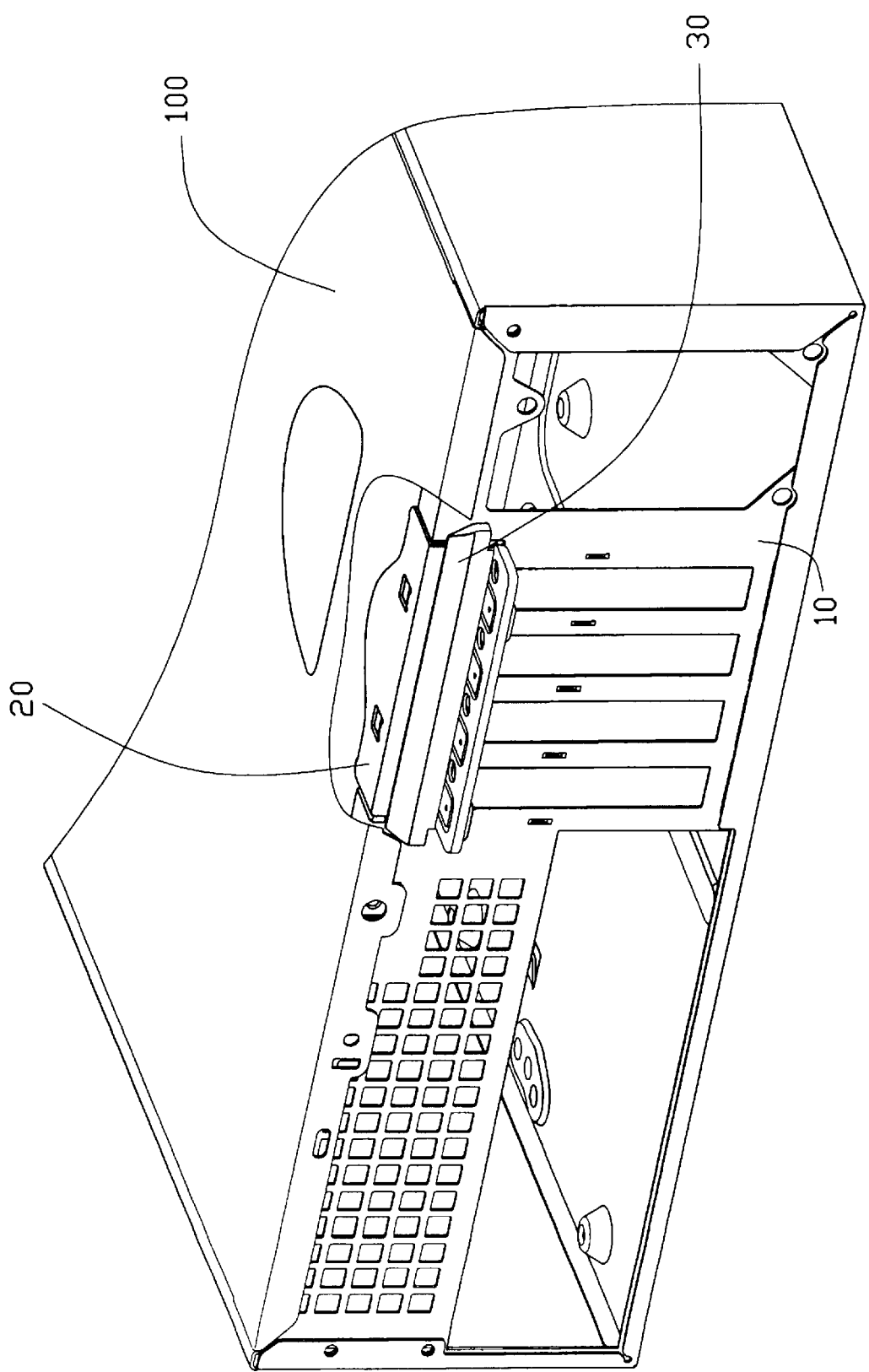
FIG. 4 is an assembled view of FIG. 1, partly cut away.

Referring to FIGS. 3 and 4, in assembly, the slide member 30 is positioned above the connecting wall 25 of the mounting frame 20. The slide member 30 is moved downwardly, with a top inner edge of the inclined wall 35 of the slide member 30 slidingly abutting the connecting wall 25. Each T-shaped latch 320 is fittingly received between a corresponding pair of clips 262. The sloped portions 326 of the catches 322 ride over the corresponding resilient tabs 252. Once the sloped portions 326 have completely ridden over the resilient tabs 252, the resilient tabs 252 rebound and snappingly engage in corresponding indented portions 324 of the catches 322. The slide member 30 is thus securely attached to the mounting frame 20.

The combined mounting frame 20 and slide member 30 is then positioned adjacent the opening 11 of the rear panel 10. The slide member 30 is bent slightly so that the slide portions 38 can be passed through the opening 11. The slide member 30 is released so that it rebounds back to its original shape, with the slide portions 38 abutting an inside face of the rear panel 10 at the opposite sides of the opening 11. Therefore the slide portions 38 are only movable in vertical directions, by way of sliding along respective courses corresponding to a height of the opening 11. The combined mounting frame 20 and slide member 30 is thus slidably attached to the rear panel 10 at the opening 11.

In operation, the combined mounting frame 20 and slide member 30 is slid upwardly so that a gap is defined between the pressing portion 21 and the support member 12. The end portions 52 of the slot covers 50 are placed on the support member 12, with the protrusions 120 of the support member 12 being received through the cutouts 56 of the end portions 52. The combined mounting frame 20 and slide member 30 is then slid downwardly. The resilient tongues 23 resiliently press corresponding end portions 52 against the support member 12. The mounting portion 28 is received in the recessed portion 16, the mounting tabs 29 of the mounting portion 28 are engaged in the mounting holes 17 of the recessed portion 16, and the protrusions 120 are engaged in the positioning holes 22 of the pressing portion 21. The combined mounting frame 20 and slide member 30 is therefore prevented from moving in horizontal directions. Thereafter, a top panel 100 is attached to the top flange 15 of the rear panel 10. The combined mounting frame 20 and slide member 30 is thus prevented from moving in vertical directions. The end portions 52 are thus securely sandwiched between the support member 12 and the pressing portion 21.

To remove the slot covers 50, the top panel 100 is detached from the rear panel 10. The combined mounting frame 20 and slide member 30 is slid upwardly. The slot covers 50 can then be easily removed from the rear panel 10.

In the present invention, the mounting frame 20 is slidably attached to the rear panel 10. When removing or installing any slot covers 50, it is not necessary to remove the mounting frame 20 from the rear panel 10. This feature allows quick and convenient removal and installation of expansion cards.

It is understood that the invention may be embodied in other forms without departing from the spirit thereof For example, the slide portions 38 of the slide member 30 may define two slide grooves at the opposite ends of the slide member 30 respectively. In such case, the slide grooves slidably receive portions of the rear panel 10 at opposite sides of the opening 11. The above-described examples and embodiments are to be considered in all respects as illustrative and not restrictive, and the invention is not to be limited to the details given herein.

What is claimed is:

1. A mounting apparatus for expansion cards, each of the expansion cards comprising a slot cover having an outwardly bent end portion, the mounting apparatus comprising:

a panel defining an opening, and comprising a support member adjacent the opening for supporting the end portions thereon;

a mounting frame comprising a pressing portion positioned on the support member and pressing downwardly upon the support member, and a mounting portion removably engaging with a top flange of the panel; and a slide member attached to the mounting frame, the slide member comprising two slide portions at opposite ends thereof respectively slidably engaged with opposite sides of the opening;

wherein the mounting frame and slide member are both slidable together as a combined unit between a first position in which the end portions of the slot covers are sandwiched between the support member and the pressing portion, and a second position in which the end portions are spaced apart and released from the pressing portion wherein the mounting frame further comprises a connecting portion interconnecting the pressing portion with the mounting portion and the connecting portion comprises a plurality of resilient tabs, and the slide member comprises a plurality of catches each comprising an indented portion snappingly receiving a corresponding resilient tab therein.

2. The mounting apparatus as described in claim 1, wherein the connecting portion defines an aperture with two clips extending from opposite sides thereof, and the slide member comprises a latch fittingly received between the clips.

3. The mounting apparatus as described in claim 2, wherein the clips are each L-shaped, and the latch is T-shaped.

4. The mounting apparatus as described in claim 1, wherein the top flange of the panel defines a recessed portion receiving the mounting portion of the mounting frame.

5. The mounting apparatus as described in claim 4, wherein the recessed portion defines a mounting hole therein, and the mounting portion comprises a mounting tab removably engaging in the mounting hole.

6. The mounting apparatus as described in claim 4, wherein the mounting apparatus further comprises a top panel attached to the top flange of the panel to retain the mounting portion in the recessed portion.

7. The mounting apparatus as described in claim 1, wherein the support member comprises a plurality of protrusions, each of the end portions defines a cutout, and the pressing portion defines a plurality of positioning holes, the protrusions extending through the cutouts and into the positioning holes.

8. The mounting apparatus as described in claim 1, wherein each of the slide portions of the slide member has an L-shaped structure slidably engaging with the panel at a corresponding side of the opening.

9. The mounting apparatus as described in claim 1, wherein each of the slide portions of the slide member defines a slide groove slidably receiving a portion of the panel at a corresponding side of the opening.

10. A mounting apparatus assembly comprising:
- a first panel defining an opening along a first axis with a support member located at a bottom side of the opening, and an expansion slot along a second axis perpendicular to the first axis;
- an expansion card having a slot cover attached to the first panel at the expansion slot;
- a mounting frame located at the opening and comprising a pressing portion cooperatively with the support member defining a space therebetween for receiving an end portion of the slot cover, the mounting frame further comprising a mounting portion, the mounting frame being slidable along the second axis while fixed relative to the first axis; and
- a second panel attached to the first panel in a direction perpendicular to the first panel to retain the mounting portion on the first panel and fix the mounting frame relative to the second axis, whereby the slot cover of the expansion card is secured in said space wherein the first panel defines a recessed portion at a top flange thereof for receiving the mounting portion, the recessed portion defines a mounting hole therein, and the mounting portion comprises a mounting tab removably engaging in the mounting hole.

11. The mounting apparatus assembly as described in claim 10, wherein the pressing portion comprises a tongue for resiliently pressing the end portion against the support member.

12. The mounting apparatus assembly as described in claim 10, wherein the mounting frame further comprises a connecting portion interconnecting the mounting portion with the pressing portion, the mounting apparatus assembly further comprises a slide member detachably attached to the connecting portion, and the slide member comprises two slide portions at opposite ends thereof respectively slidably engaged with the first panel at opposite sides of the opening.

13. The mounting apparatus assembly as described in claim 12, wherein the connecting portion comprises a plurality of resilient tabs, and the slide member comprises a plurality of catches each including an indented portion snappingly receiving a corresponding resilient tab therein.

14. The mounting apparatus assembly as described in claim 13, wherein the connecting portion defines a slot with two clips extending from opposite sides of the slot, and the slide member comprises a latch engaging between the clips.

15. The mounting apparatus assembly as described in claim 14, wherein each of the slide portions of the slide member defines a slide groove slidably receiving a portion of the first panel at a corresponding side of the opening.

16. A mounting apparatus assembly comprising:
- a first main structure panel defining an elongated opening along a first direction with a support member located at one lengthwise edge of said opening, and a plurality of expansion slots located under said support member and extending in a second direction perpendicular to said first direction;
- a plurality of slot covers attached to the support member and covering the corresponding expansion slots;
- a mounting frame combination covering said opening, said mounting frame combination including an elongated pressing portion positioned on the support member and pressing downwardly upon the support member to sandwich horizontal portions of the slot covers therebetween; and
- a second main structure panel which is a separate component from the mounting frame combination wherein the second main structure panel is attached to the first main structure panel in a direction perpendicular to the first panel and abutting against the mounting frame combination to prohibit the mounting frame combination from moving away from the slot covers; wherein when the second panel, is removed the mounting frame combination may be moved from the slot covers to expose the opening for removal of the slot covers.

17. The mounting apparatus assembly as described in claim 16, wherein said mounting frame combination equipped with a sliding structure slidably latched around a periphery of the opening, and said thus mounting frame, combination movable relative to the slot covers generally along the second direction.

\* \* \* \* \*